United States Patent
Isozaki

(10) Patent No.: US 9,406,633 B2
(45) Date of Patent: Aug. 2, 2016

(54) CONTACT COMPONENT AND SEMICONDUCTOR MODULE

(71) Applicant: FUJI ELECTRIC CO., LTD., Kawasaki-shi, Kanagawa (JP)

(72) Inventor: Makoto Isozaki, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/817,894

(22) Filed: Aug. 4, 2015

(65) Prior Publication Data

US 2015/0340333 A1    Nov. 26, 2015

Related U.S. Application Data

(63) Continuation of application No. PCT/JP2014/056347, filed on Mar. 11, 2014.

(30) Foreign Application Priority Data

Mar. 21, 2013    (JP) ................. 2013-058462

(51) Int. Cl.
| | | |
|---|---|---|
| *H01L 23/52* | (2006.01) | |
| *H01L 23/00* | (2006.01) | |
| *H01L 23/498* | (2006.01) | |
| *H05K 3/34* | (2006.01) | |

(52) U.S. Cl.
CPC .......... *H01L 24/13* (2013.01); *H01L 23/49811* (2013.01); *H05K 3/3426* (2013.01); *H01L23/49844* (2013.01); *H01L 2224/13011* (2013.01); *H01L 2224/13017* (2013.01); *H01L 2224/45124* (2013.01); *H01L 2224/48091* (2013.01); *H01L 2224/48137* (2013.01); *H05K 2201/10916* (2013.01); *H05K 2201/2036* (2013.01); *Y02P 70/613* (2015.11)

(58) Field of Classification Search
CPC .......... H01R 12/57; H01R 4/02; H01R 4/023; H01R 4/021; H05K 3/3426; H05K 2201/10984; H01L 24/13; H01L 2224/16; H01L 23/49827; H01L 24/16; H01L 24/45; H01L 21/486; H01L 2225/06541; H01L 2224/49111; H01L 21/76877; H01L 2224/16146
USPC .......... 257/678, 773, 774, 776, 786; 438/637–640, 667
See application file for complete search history.

(56) References Cited

U.S. PATENT DOCUMENTS

| | | | |
|---|---|---|---|
| 5,209,681 A | 5/1993 | Brown | |
| 8,087,943 B2* | 1/2012 | Stolze | ........... H01L 25/072 439/83 |
| 2009/0194884 A1 | 8/2009 | Stolze | |
| 2012/0234595 A1 | 9/2012 | Tamura et al. | |

FOREIGN PATENT DOCUMENTS

| | | |
|---|---|---|
| JP | H01-315167 A | 12/1989 |
| JP | H02-139880 A | 5/1990 |
| JP | H06-020735 A | 1/1994 |
| JP | 2009-289980 A | 12/2009 |
| JP | 2010-186953 A | 8/2010 |
| JP | 2010-283107 A | 12/2010 |
| JP | 2011-138998 A | 7/2011 |
| JP | 2012-199340 A | 10/2012 |

OTHER PUBLICATIONS

PCT, "International Search Report for International Application No. PCT/JP2014/056347".
Japan Patent Office, Office Action for Japanese Patent Application No. 2015-506714, Jun. 7, 2016.

* cited by examiner

*Primary Examiner* — Hsien Ming Lee
(74) *Attorney, Agent, or Firm* — Manabu Kanesaka

(57) ABSTRACT

A contact component adapted to be soldered onto a metal region provided on an insulating substrate of a semiconductor module includes a cylindrical portion; a hollow hole for fitting an external terminal; and a flange formed at a lower end portion of the cylindrical portion and having a diameter larger than an external diameter of the cylindrical portion. An end face of the flange adapted to be soldered includes a flat bottom surface and a concave portion extending from an inner circumference edge of the cylindrical portion in the flat bottom surface to an outer circumference edge of the flange. The cylindrical portion includes a cut-out portion at an inner side of a lower end thereof.

13 Claims, 14 Drawing Sheets

FIG. 1(a)
FIG. 1(b)
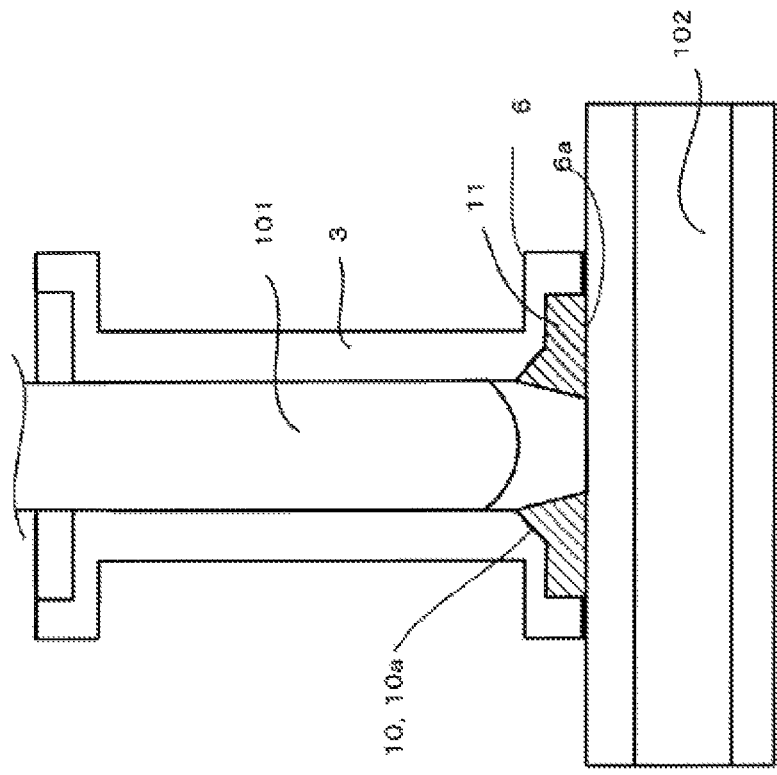
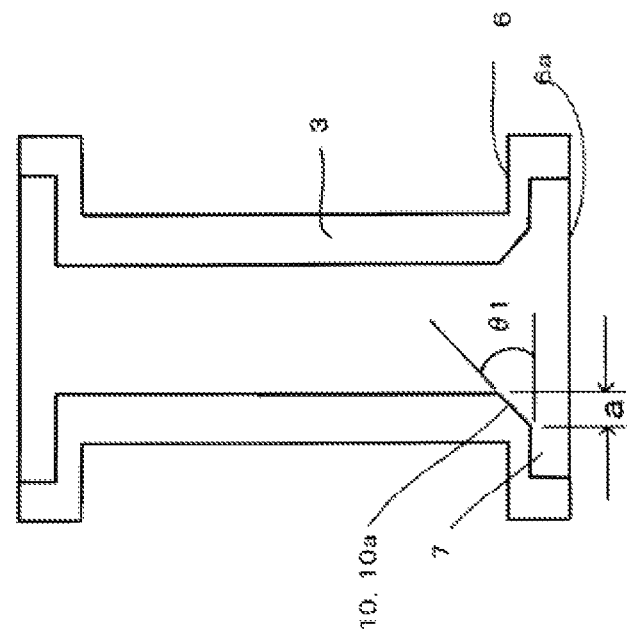

CONTACT COMPONENT AND SEMICONDUCTOR MODULE

CROSS-REFERENCES TO RELATED APPLICATIONS

The present application is a continuation Application of PCT International Application No. PCT/JP2014/056347 filed Mar. 11, 2014, which claims priority of Japanese Patent Application No. 2013-058462 filed Mar. 21, 2013, the disclosure of which is incorporated herein.

TECHNICAL FIELD

The present invention relates to a contact component mounted on an insulating substrate constituting a semiconductor module by soldering, and having a structure enabling electroconductive connection with the exterior by inserting an external output terminal thereinto, and to a semiconductor module on which the contact component is mounted.

BACKGROUND ART

There are semiconductor modules, inside which there is provided an insulating substrate 102 that requires to be electroconductively connected with an external circuit by external output terminals 101 which are wired from an external circuit (not illustrated), as shown in FIGS. 13(a), 13(b). FIG. 12 shows a semiconductor module 100 of this type. In this semiconductor module 100, cylindrical contact components 103 are soldered in advance to a predetermined plurality of locations on the insulating substrate 102, and a plurality of external output terminals 101 having a corresponding arrangement are inserted respectively into the central holes of the contact components 103. These external output terminals 101 are connected to a semiconductor chip 104 (device chip, circuit chip), or the like, by aluminum wires 105, or the like. Moreover, the insulating substrate 102 is mounted on a metal substrate 109 and is covered with a resin case 108 which is fixed on top of the metal substrate 109. When the contact components 103 are soldered onto the insulating substrate 102, it is very important for the solder to maintain stable strength over a long period of time. Therefore, as indicated by the perspective view in FIG. 14, the conventional contact components 103 are each provided with a flange 106 of large diameter so as to increase the surface area of the end face of the cylinder, in order to stably stand the components 103 at the predetermined plurality of locations on the insulating substrate 102, as well as to ensure the solder junction strength. Moreover, a concave portion 107 which forms a solder reservoir section when forming the junction and which can ensure a predetermined thickness of solder is formed in the end face 106a of the flange 106 (Patent Document 1).

FIG. 6 shows a cross-sectional view along the line A1-A2 following the axis of the cylindrical shape of the contact components 103 in FIG. 14. In FIG. 7, a contact component 103a, similar to the contact components 103 in FIG. 6, having a structure in which a curve 110 (radius of curvature 0.1 mm) is applied to the edge at the end of the cylinder is shown in the cross-sectional view. Paste solder is used to affix the contact components 103, 103a of this type to the predetermined plurality of locations on the insulating substrate 102. For example, paste solder is printed in the arrangement pattern of the predetermined plurality of contact components 103 on the insulating substrate 102, and a heating process is applied to affix the contact components 103 while applying a predetermined load to the end faces of the flanges 106 of the contact components 103.

In this way, when soldering the end faces of the flanges 106 of the contact components 103 to the insulating substrate 102, the solder 111 pressed against the inner diameter side of each flange 106, of the solder 111 on the lower side of the flange 106, enters into the concave portion 107 inside the flange 106, as shown in FIG. 5, filling the inside of the cylinder, forming a layer of solder 111 having a thickness of several hundred microns, and thereby enhancing the junction strength. On the other hand, the junction strength is also increased due to the solder 111 which is pressed against the outer sides of the flanges 106 forming solder fillets 111a having a height corresponding to the thickness of the flange 106.

Inside the cylinder of each of the contact components 103 in the semiconductor module 100, the thickness of the solder inside the cylinder is limited to no more than approximately 500 µm in order to guarantee the insertion depth of the external output terminal 101 which is inserted in order to connect electroconductively with an external circuit. Moreover, the outer diameter of the external output terminal 101 is set to be close to the inner diameter of the cylinder, in order to ensure an electroconductive contact when the terminals are inserted inside the cylinders of the contact components 103. In order to ensure this electroconductive contact, desirably, the terminal is shaped as a quadrilateral rod to be inserted into the cylindrical hole.

Other prior art documents relating to the technology described above disclose technology for preventing the climbing up of solder in the lead terminals of an IC (integrated circuit device) (Patent Documents 2 and 3). Technology has also been disclosed which prevents the climbing up of solder inside hollow terminals (Patent Document 4).

Patent Document 1: US2009/0194884 A1 (FIGS. 1, 4 and 12)

Patent Document 2: Japanese Patent Application Publication No. 1989-315167 ("Function")

Patent Document 3: Japanese Patent Application Publication No. 2012-199340 (Background Art)

Patent Document 4: Japanese Patent Application Publication No. 1994-020735 (Abstract, Object)

DISCLOSURE OF THE INVENTION

As shown in FIG. 5 described above, the contact component 103 is provided with a flange structure that increases the surface area of the end face in order to increase the strength of the junction with the insulating substrate 102, and therefore an appropriate amount of solder is required. On the other hand, if the amount of solder is increased, then due to the effects of the pressure-reducing heating furnace which is normally used for soldering, a phenomenon frequently occurs in which the solder 111 which has been filled inside the contact component 103 climbs up the inner walls of the cylinder due to a capillary action, as shown in FIG. 8, and either collects on the inner walls or is discharged from the upper opening of the cylinder. When this phenomenon occurs, problems arise when an external output terminal is inserted into the central hole of the contact component 103, resulting in a defective component. This wicking phenomenon is known to occur more readily when the amount of solder is greater. Therefore, the amount of solder should be reduced in order to prevent the wicking phenomenon. However, if the amount of solder is reduced, then it becomes difficult to ensure the required minimum junction strength required for long-term reliability (for example, 10 N). Consequently, it is necessary to adjust the amount of solder so as to reduce the amount of solder entering inside the cylinder and, in particularly, into the central hole as little as possible, while having an amount of solder which can ensure the required minimum junction strength of 10 N.

However, it is known that, when adjusting the amount of solder applied by printing of paste solder, it is extremely difficult to adjust the amount of solder to an amount which achieves both, prevention of climb-up of the solder and junction strength yielding long-term reliability, simply by adjusting the amount of solder alone. For instance, in an experiment in which the amount of solder contributing to the formation of the junction (the diagonally hatched portion) is reduced successively in FIGS. 9 (a) to 9(c) from the amount of solder shown in FIG. 4(b), the form of the junction changes successively as shown in the drawings, and the junction strength of the contact component 103 declines successively in accordance with this. When the junction strength of the contact component 103 is less than the value of 10 N indicated above, the reliability of the semiconductor module declines, and hence this must be avoided. In FIG. 9(a), the junction strength is good, but there is still a large amount of solder inside the cylinder and the wicking phenomenon cannot be eliminated. In FIG. 9(b), the wicking phenomenon can be eliminated, but there may be problems with the reliability of the junction strength. In particular, when the amount of solder is reduced to the extent indicated in FIG. 9(c), the junction strength is often lower than the minimum necessary junction strength of 10 N, and hence there is an issue in that problems such as detachment of the external output terminals from the semiconductor module occur very frequently. As a result, when adjusting the amount of solder achieved by printing of a paste solder, it is necessary to adjust the amount of solder to an amount between those illustrated in FIGS. 9(a) and 9(b), but it was concluded that controlling the amount of solder in this way is very difficult to achieve.

The present invention was devised in view of the points described above. An object of the present invention is to provide a contact component, and a semiconductor module, wherein a solder junction strength equal to or greater than that of the conventional art can be obtained, even in a solder junction state in which the amount of solder is reduced in order to prevent defects due to climb-up of solder and in which the inside of the cylinder of the contact component is not filled with solder.

In order to achieve the aforementioned object, a contact component according to one aspect of the invention is adapted to be soldered onto a metal region provided on an insulating substrate of a semiconductor module. The contact component includes a cylindrical portion, a hollow hole for fitting an external terminal, a flange formed at a lower end portion of the cylindrical portion, having a diameter larger than an external diameter of the cylindrical portion, wherein an end face of the flange adapted to be soldered includes a flat bottom surface and a concave portion extending from an inner circumference edge of the cylindrical portion to an outer circumference edge of the flange. A cut-out portion is provided at an inner side of a lower end of the cylindrical portion.

In the second aspect of the invention, desirably, the cut-out portion is a chamfered portion formed in at least a portion of the inner side of the lower end of the cylindrical portion.

In the third aspect of the invention, desirably, the cut-out portion is a step portion formed in at least a portion of the inner side of the lower end of the cylindrical.

In the fourth aspect of the invention, desirably, the cut-out portion is a recessed surface portion formed in at least a portion of the inner side of the lower end of the cylindrical portion.

In the fifth aspect of the invention, more desirably, the cross-sectional shape of the hollow hole for fitting the external terminal is a circular shape or a square shape.

In order to achieve the object of the invention, the sixth aspect of the invention is a contact component adapted to be soldered onto a metal region provided on an insulating substrate of a semiconductor module. The contact component includes a cylindrical portion, a hollow hole for fitting an external terminal, a flange formed at a lower end portion of the cylindrical portion, the flange having a diameter larger than an external diameter of the cylindrical portion, and a height at an outer circumference thereof no less than two times a thickness of the cylindrical portion, wherein an end face of the flange adapted to be soldered includes a flat bottom surface and a concave portion extending from an inner circumference edge of the cylindrical portion to an outer circumference edge of the flange.

In the seventh aspect of the invention, desirably, the flange in which the height at the outer circumference thereof is no less than two times the thickness of the cylindrical portion of the contact component, is a processed surface forming a projecting portion extending upward in at least a portion of the outer circumference of the flange.

In the eighth aspect of the invention, more desirably, the cross-sectional shape of the hollow hole for fitting the external terminal is a circular shape or a square shape.

Furthermore, in the ninth aspect of the invention, desirably, the flange is provided at two ends of the cylindrical portion, since a solder junction can be formed on either of the flange end faces of the contact component and hence the work efficiency is improved.

In the tenth aspect of the invention, it is possible to achieve a semiconductor module in which the contact component for a semiconductor module according to the first aspect is mounted on an insulating substrate.

In the eleventh aspect of the invention, it is possible to achieve a semiconductor module in which the contact component for a semiconductor module according to the sixth aspect is mounted on an insulating substrate.

According to this invention, it is possible to provide a contact component for a semiconductor module, and a semiconductor module on which the contact component is mounted, wherein a solder junction strength equal to or greater than that of the conventional art can be obtained, even in a solder junction state in which the amount of solder is reduced in order to prevent defects due to climb-up of the solder and in which the inside of the cylindrical portion of a cylindrical contact component 103 is not filled with solder.

The abovementioned and further objects, characteristics and advantages of the present invention will become apparent from the following description related to the accompanying drawings which depict desirable embodiments of the present invention.

BRIEF DESCRIPTION OF THE DRAWINGS

FIG. 1(a) is a cross-sectional view of the contact component according to the first embodiment of the present invention, and FIG. 1(b) is a cross-sectional view of the portion inside the broken line frame in FIG. 11, depicting a state where the contact component has been soldered onto an insulating substrate.

BEST MODE FOR CARRYING OUT THE INVENTION

Figure 2A:
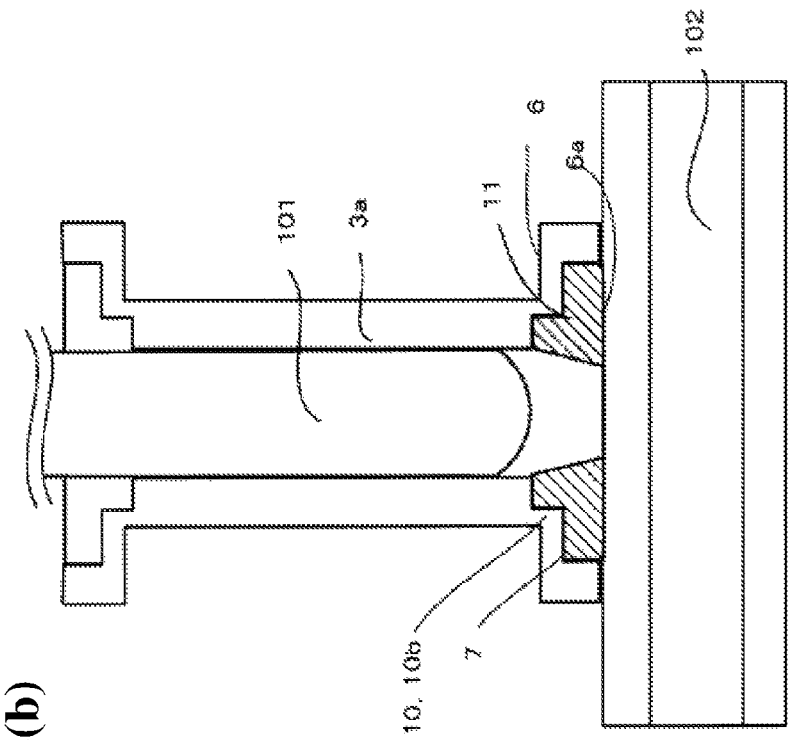
FIG. 2(a) is a cross-sectional view of the contact component according to the second embodiment of the present invention.

Below, the embodiments of a cylindrical contact component used in the semiconductor module according to the present invention, a semiconductor module on which the contact component is mounted, and a method for manufacturing the same, will be described in detail with reference to the drawings. In the following description of the embodiments and the accompanying drawings, similar parts of the composition are labelled with the same reference numerals, and repeated description thereof is omitted. Furthermore, the accompanying drawings which are described in the embodiments are not drawn to an accurate scale or in dimensional proportion, in order to make them easier to read and understand.

First Embodiment

Figure 11:
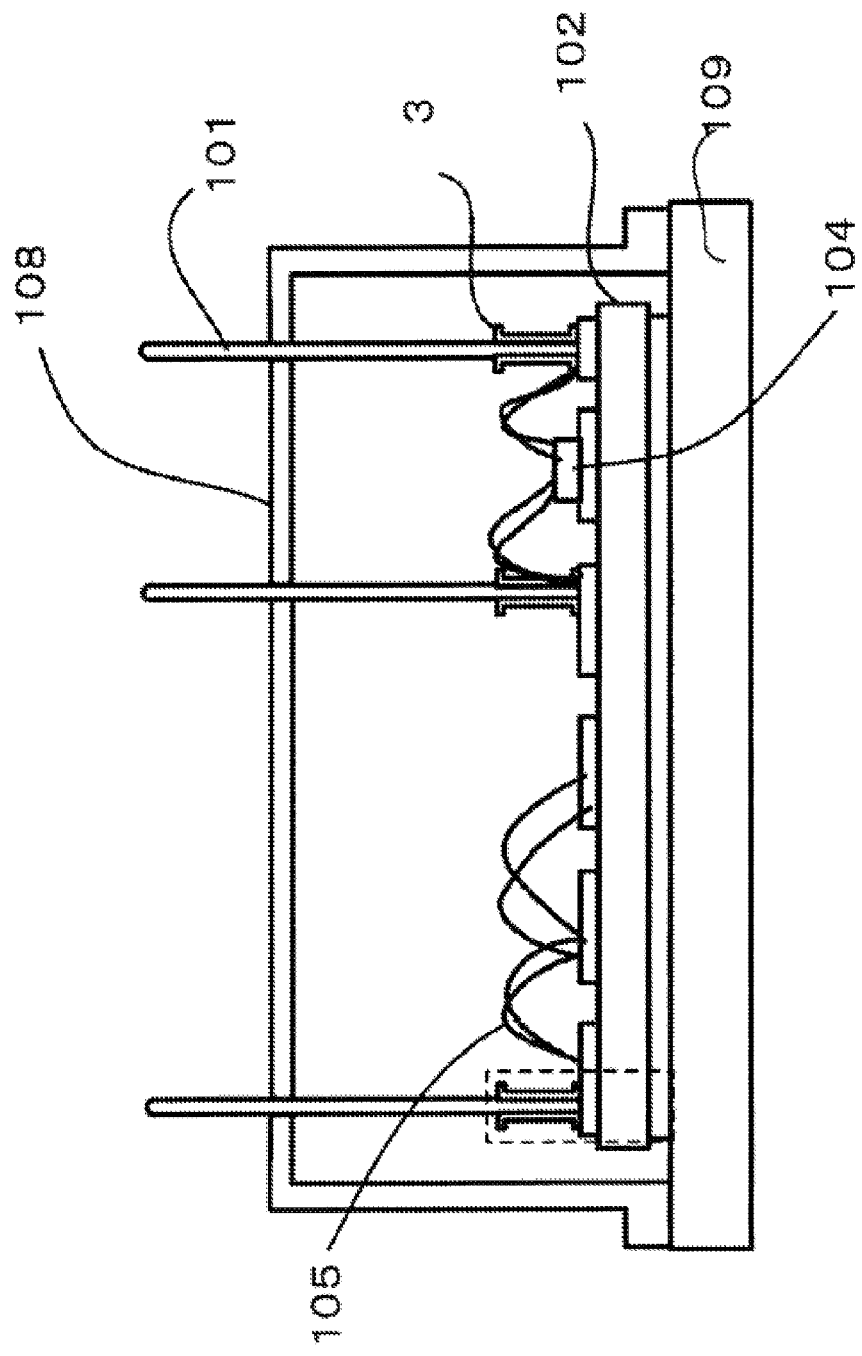
FIG. 11 is a cross-sectional view of a semiconductor module on which the contact component of the present invention is mounted.

FIG. 11 is a cross-sectional view of a semiconductor module on which the contact component of the present invention is mounted. FIG. 1 (a) is a cross-sectional view of a contact component according to the first embodiment of the present invention. FIG. 1(b) is a cross-sectional view of the portion inside the broken line frame in FIG. 11, depicting a state where the contact component according to the first embodiment of the present invention has been soldered onto an insulating substrate. Paste solder is used to affix contact components 3 of this type to a predetermined plurality of locations on the insulating substrate 102. For example, paste solder is printed in the arrangement pattern of the predetermined plurality of contact components 3 on the insulating substrate 102, and a heating process is applied in a pressure-reducing heating furnace to affix the components while applying a predetermined load to the end faces of the flanges 6 of the contact components 3. The contact component 3 described above is mounted on the insulating substrate 102 formed with a predetermined circuit including a semiconductor chip 104 and other electronic components, and the like. Moreover, a semiconductor module 200 is formed by fixing a metal substrate 109 to the lower side of the insulating substrate 102 and fixing a resin case 108 to the outer circumference of the metal substrate 109.

Figure 12:
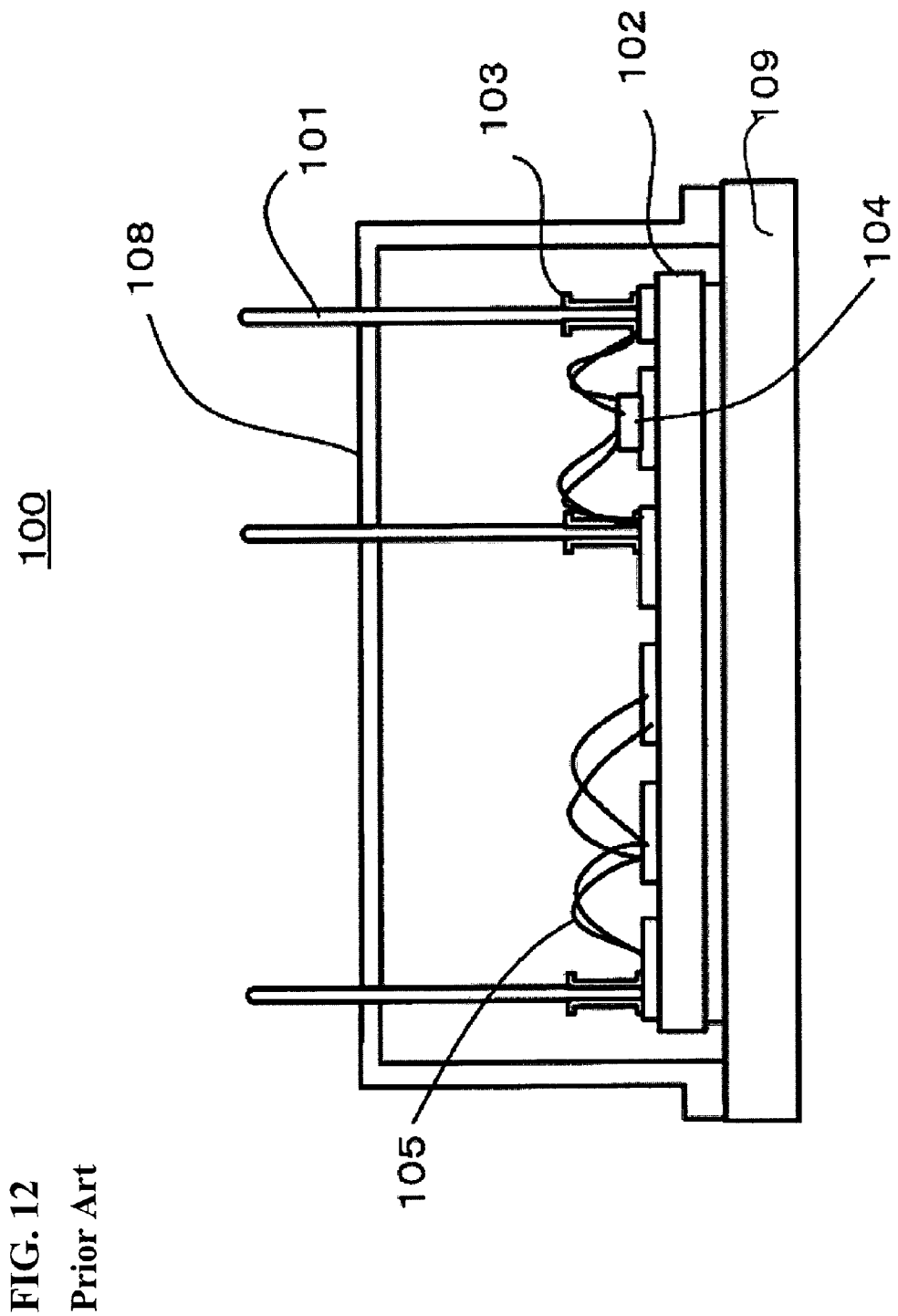
FIG. 12 is a cross-sectional view of a semiconductor module on which the conventional contact component is mounted.

The semiconductor module 200 according to the present invention (FIG. 11) differs from the conventional semiconductor module 100 in that the contact component 103 mounted on the conventional semiconductor module 100 (FIG. 12) is changed to the contact component 3 according to the present invention. However, the remainder of the structure and the mounted components may be the same or different. In FIG. 1(b), a chamfered portion 10a is processed as a cut-out portion about the whole circumference of the inner circumference edge 10 of the contact component 3 when the concave portion 7 inside the end face 6a of the flange 6 of the contact component 3 is filled with the solder 11 indicated by the diagonal hatching. Therefore, the space in the concave portion 7 is enlarged and the amount of solder which collects in the concave portion 7 on the lower side of the flange 6 can be increased. The dimension of the chamfered portion 10a can be set to a=0.145 mm and angle θ1=45° in FIG. 1(a), for example. Chamfering of this type can be formed by cutting, but an efficient method is to form the chamfer simultaneously with a pressing process when forming the flange on the cylindrical wire material which has been cut to a predetermined length. Furthermore, although the flange 6 formed on the end of the contact component 3 achieves the objective of fixing to the insulating substrate 102, even if formed on one side only, it is desirable from the viewpoint of raising the efficiency of assembly work to form a flange on either end as shown in FIGS. 1(a) and 1(b). The increase in the amount of solder caused by the chamfered portion 10a correspondingly reduces the amount of solder which enters into the cylindrical space in the center of the contact component 3. Furthermore, by providing the chamfered portion 10a, the contact surface area with the solder 11 is also increased, and therefore, it is possible to increase the solder junction strength. Consequently, it is possible to suppress the wicking phenomenon of the solder that occurs in the conventional art, by reducing the amount of solder which enters into the central cylindrical space. Moreover, by providing the chamfered portion 10a on the inner circumference edge 10, it is possible to maintain or increase the solder junction strength, even if the amount of solder is smaller than that in the conventional art. The contact component 3 is formed by a metal material having good conductivity, such as iron or copper, which is treated with nickel plating or also gold plating, which have good solder wettability.

In this first embodiment, the beneficial effect described above is exhibited sufficiently provided that the chamfering angle θ1 is in a range of 30° to 60°. The beneficial effect described above is exhibited sufficiently provided that the chamfering dimension a is between 0.1 mm and 0.2 mm. Furthermore, in the description given above, an example is introduced in which a chamfered portion 10a is provided about the whole circumference of the inner circumference edge 10 of the contact component 3, but the beneficial effect described above is exhibited sufficiently even if the chamfered portion 10a is provided in a portion of the inner circumference edge 10 of the contact component 3. Moreover, an example was introduced in which the contact component 3 has a circular cross-section, but the cross-section may also be a square.

Second Embodiment

Figure 2B:
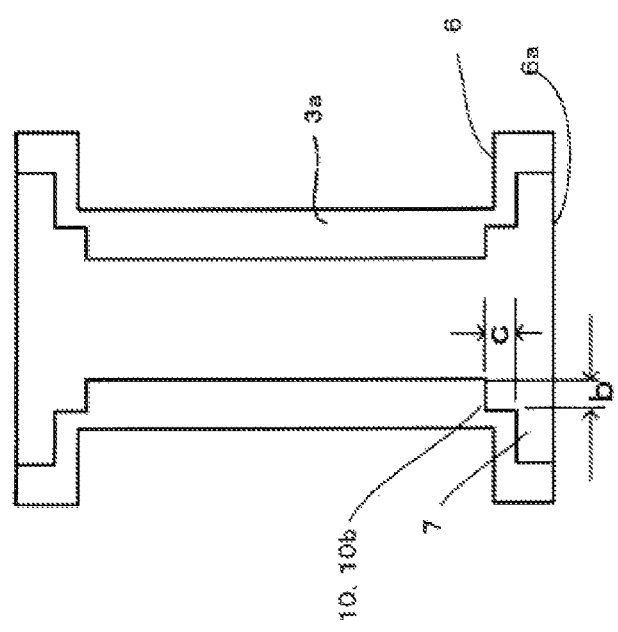
FIG. 2(b) is a cross-sectional view of the portion inside the broken line frame in FIG. 11, depicting a state where the contact component has been soldered onto an insulating substrate.

FIG. 2(a) is a cross-sectional view of a contact component according to the second embodiment of the present invention. FIG. 2(b) is a cross-sectional view of the portion inside the broken line frame in FIG. 11, depicting a state where the contact component according to the second embodiment of the present invention has been soldered onto an insulating substrate. The semiconductor module 201 according to the second embodiment of the present invention differs in that the contact component 3 mounted on the semiconductor module 200 according to the first embodiment is changed to a contact component 3a according to the present invention. However, the remainder of the structure and mounted components may be the same or different. In FIG. 2(b), a step portion 10b is processed as a cut-out about the whole circumference of the inner circumference edge 10 of the contact component 3a when the concave portion 7 inside the end face 6a of the flange 6 of the contact component 3a is filled with the solder 11 indicated by the diagonal hatching. Therefore, the space in the concave portion is enlarged and the amount of solder which collects in the concave portion 7 on the lower side of the flange 6 can be increased. The increase in the amount of solder correspondingly reduces the amount of solder which enters into the cylindrical space in the center of the contact component 3a. Furthermore, by providing the step portion 10b, the contact surface area with the solder 11 is also increased, and therefore it is possible to increase the solder junction strength. Consequently, it is possible to suppress the wicking phenomenon of the solder that occurs in the conventional art, by reducing the amount of solder which enters into the central cylindrical space. Moreover, by providing the step portion 10b on the inner circumference edge 10, it is possible to maintain or increase the solder junction strength, even if the amount of solder is smaller than that in the conventional art.

In the second embodiment, the beneficial effect described above is exhibited provided that the dimensions b and c of the step portion 10b are between 0.1 mm and 0.2 mm in a range that does not exceed the thickness of the cylindrical material. Furthermore, in the description given above, an example is introduced in which a step portion 10b is provided about the whole circumference of the inner circumference edge 10 of the contact component 3a, but the beneficial effect described above is exhibited even if the step portion 10b is provided in a portion of the inner circumference edge 10 of the contact component 3a. Moreover, an example was introduced in which the contact component 3a has a circular cross-section, but the cross-section may also be a square. Moreover, an example was introduced in which the step portion 10b is a single step, but this step portion 10b may be composed of a plurality of steps and have a step-shaped cross-section.

Third Embodiment

Figure 3:
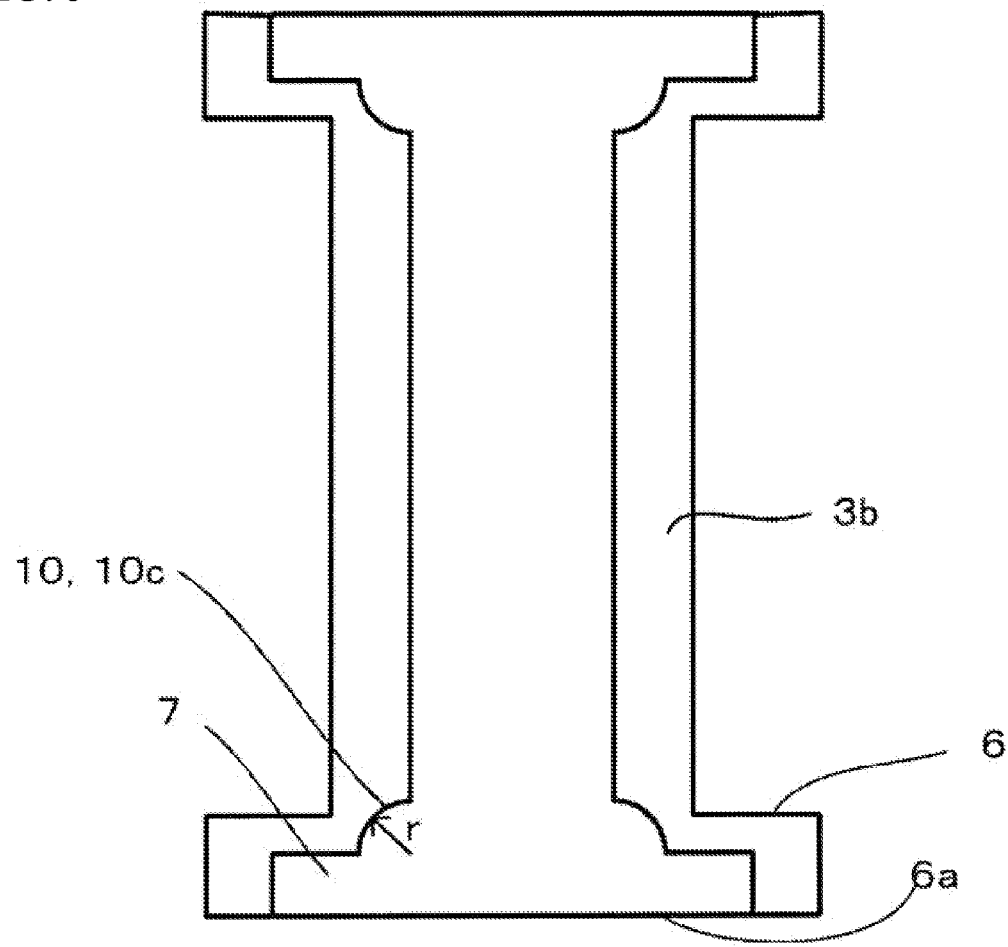
FIG. 3 is a cross-sectional view of a contact component according to the third embodiment of the present invention.

FIG. 3 is a cross-sectional view of a contact component according to the third embodiment of the present invention. In this embodiment, the step portion 10b described in the second embodiment is formed as a groove 10c (recessed surface portion) having a circular arc-shaped cross-section. However, the remainder of the structure and mounted components may be the same as or different to the first embodiment. In this embodiment too, when the concave portion 7 in the end face 6a of the flange 6 of the contact component 3b is filled with the solder 11, the amount of solder which collects in the concave portion 7 on the lower side of the flange 6 can be increased. This increase in the amount of solder correspondingly reduces the amount of solder which enters into the cylindrical space in the center of the contact component 3b. Furthermore, by processing the groove 10c, the contact surface area with the solder 11 is also increased, and therefore it is possible to increase the solder junction strength. Consequently, it is possible to suppress the wicking phenomenon of the solder that occurs in the conventional art, by reducing the amount of solder which enters into the central cylindrical space. Moreover, by providing the groove 10c as a cut-out on the inner circumference edge 10, it is possible to maintain or increase the solder junction strength, even if the amount of solder is smaller than that in the conventional art.

In this third embodiment, the beneficial effects described above are exhibited provided that the processing radius r of the groove 10c having a circular arc-shaped cross-section is between 0.1 mm and 0.2 mm, in a range that does not exceed the thickness of the cylindrical material. Furthermore, in the description given above, an example is introduced in which a groove 10c is provided about the whole circumference of the inner circumference edge 10 of the contact component 3b, but the beneficial effect described above is exhibited even if the groove 10c is provided in a portion of the inner circumference edge 10 of the contact component 3b. Moreover, an example was introduced in which the contact component 3b has a circular cross-section, but the cross-section may also be a square.

Fourth Embodiment

Figure 4A:
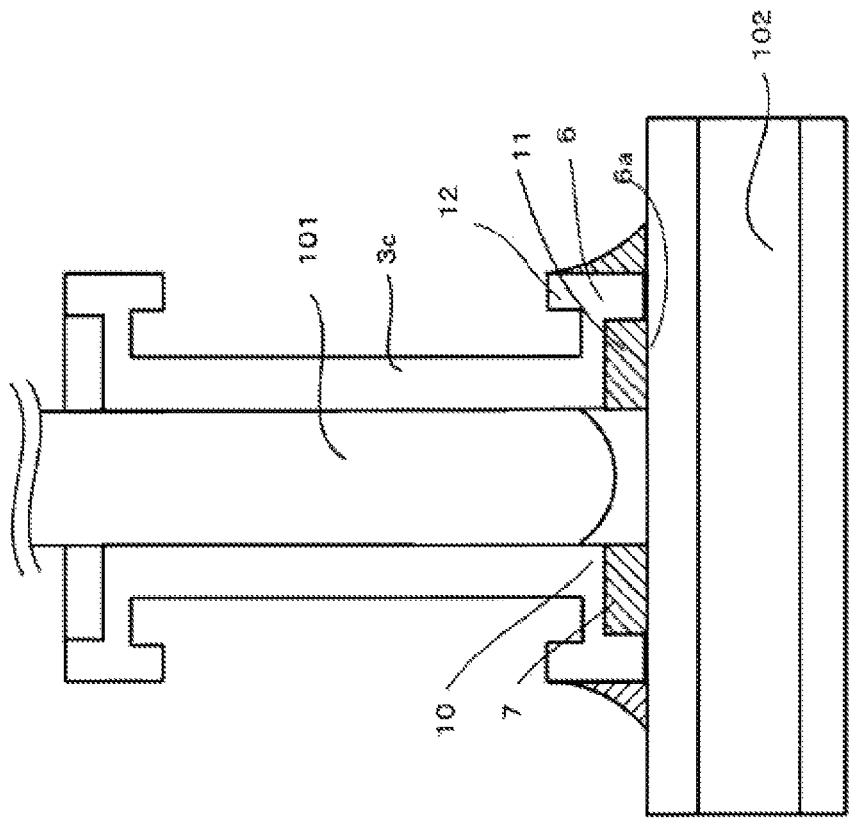
FIG. 4(a) is a cross-sectional view of the contact component according to the fourth embodiment of the present invention.
Figure 4B:
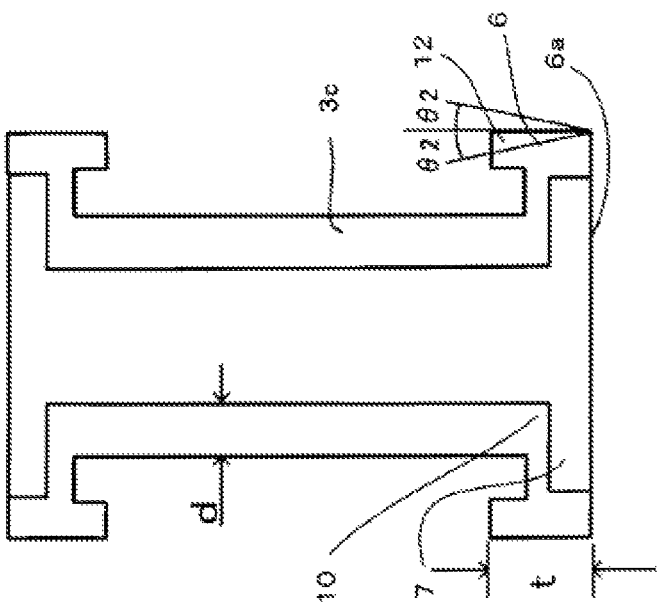
FIG. 4(b) is a cross-sectional view of the portion inside the broken line frame in FIG. 11, depicting a state where the contact component has been soldered onto an insulating substrate.
Figure 5:
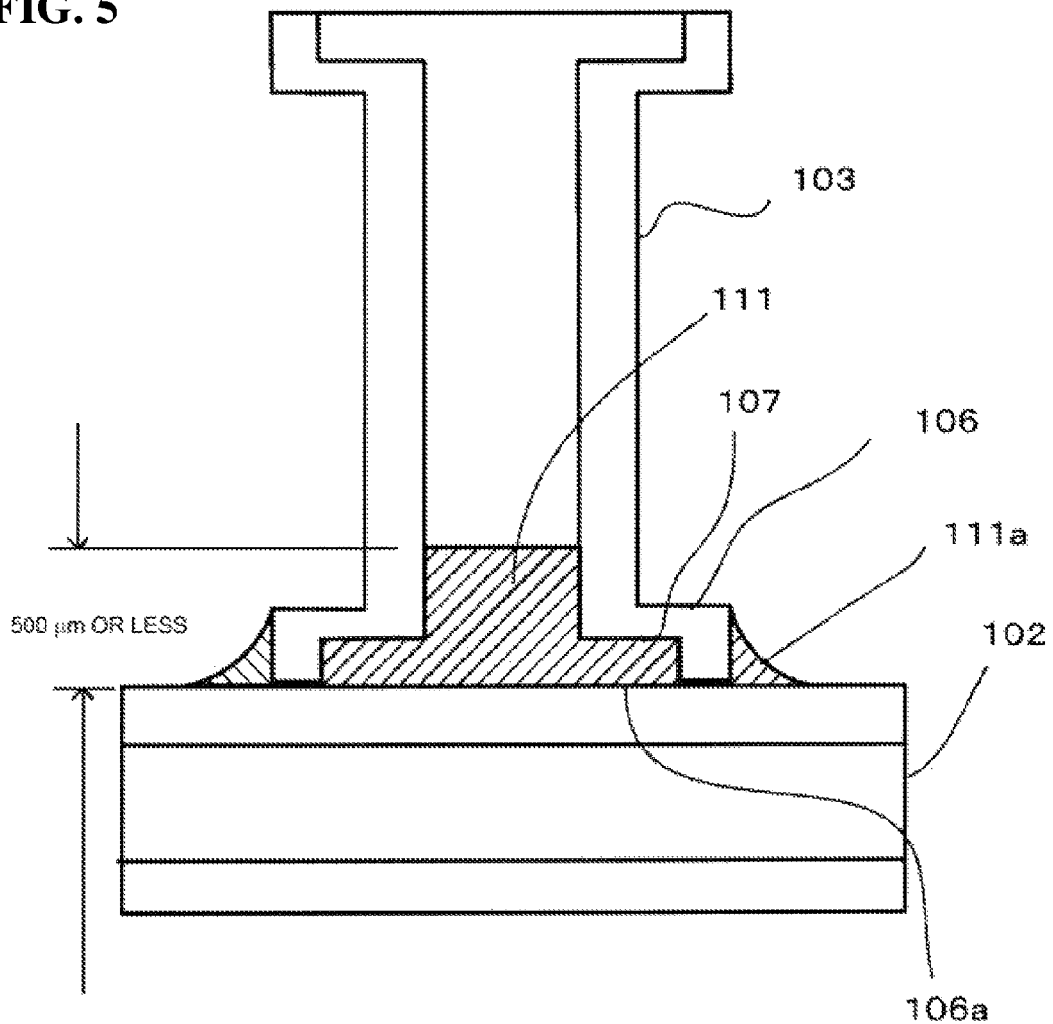
FIG. 5 is a cross-sectional view showing a state where the flange end face of a conventional contact component is soldered onto an insulating substrate.
Figure 6:
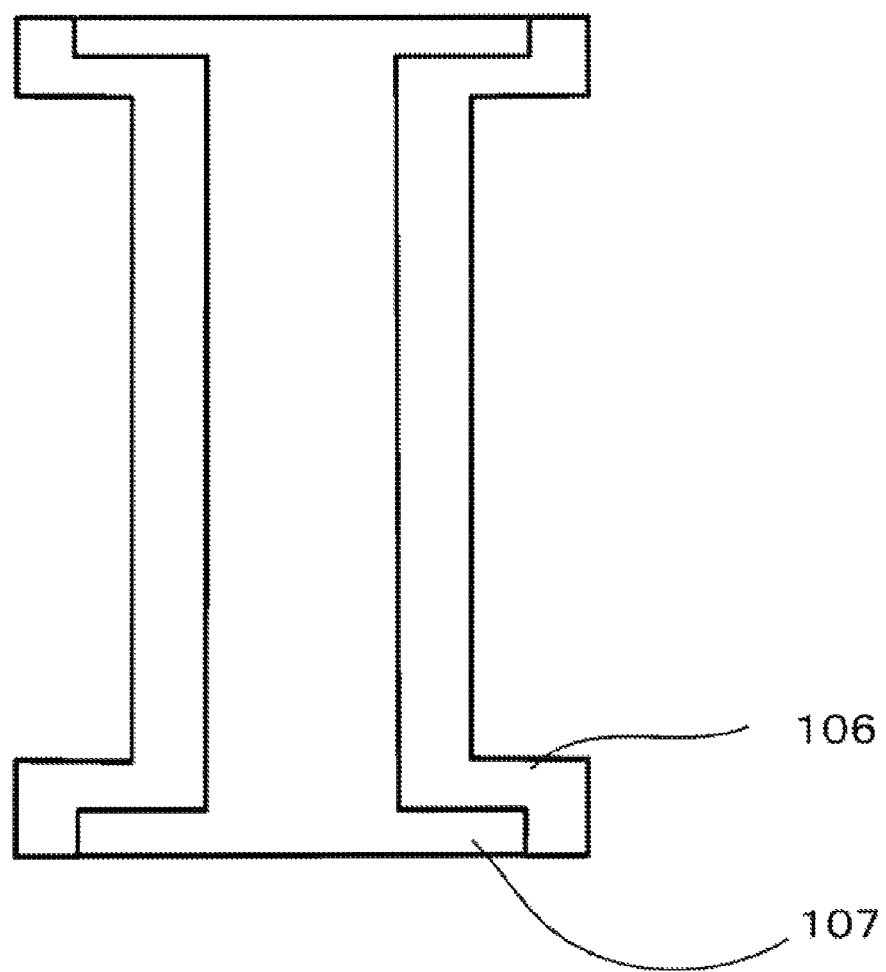
FIG. 6 is a cross-sectional view along the line A1-A2 in FIG. 14, which is along the axis of the cylinder of a conventional contact component.
Figure 7:
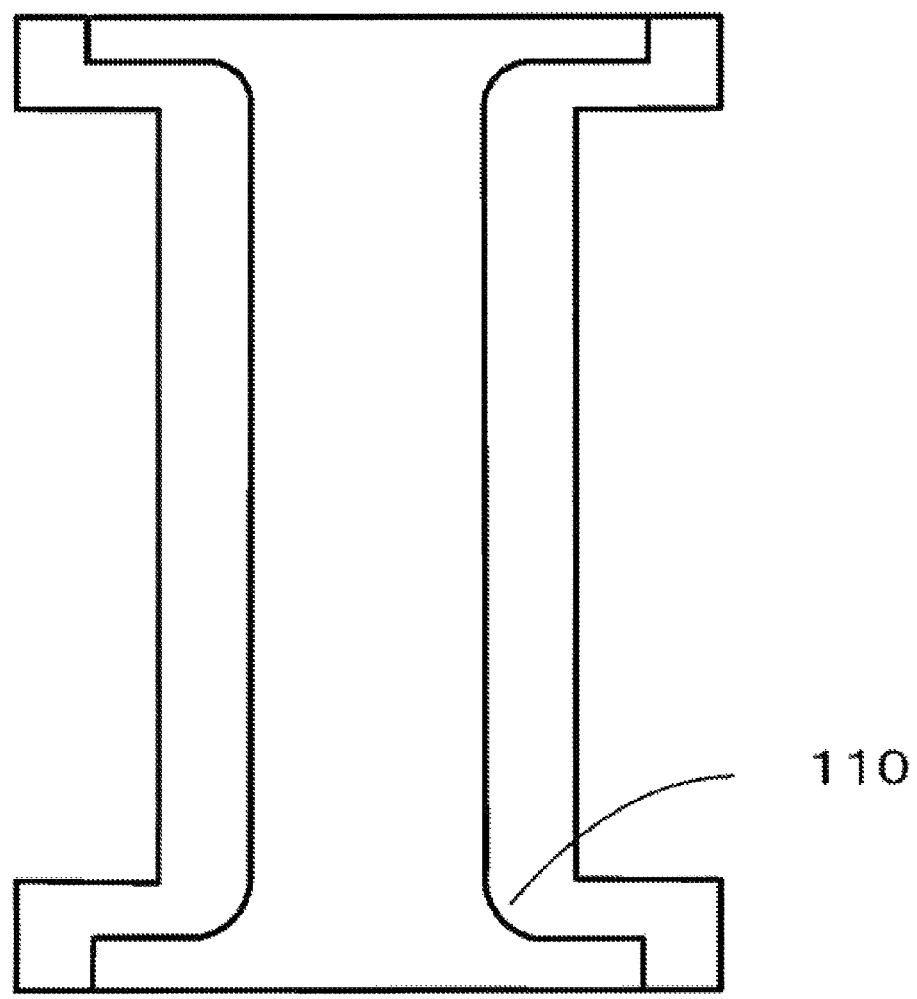
FIG. 7 is a cross-sectional view in which a curve is applied to the edge of the inner circumference portion of the cylinder in FIG. 6.
Figure 8:
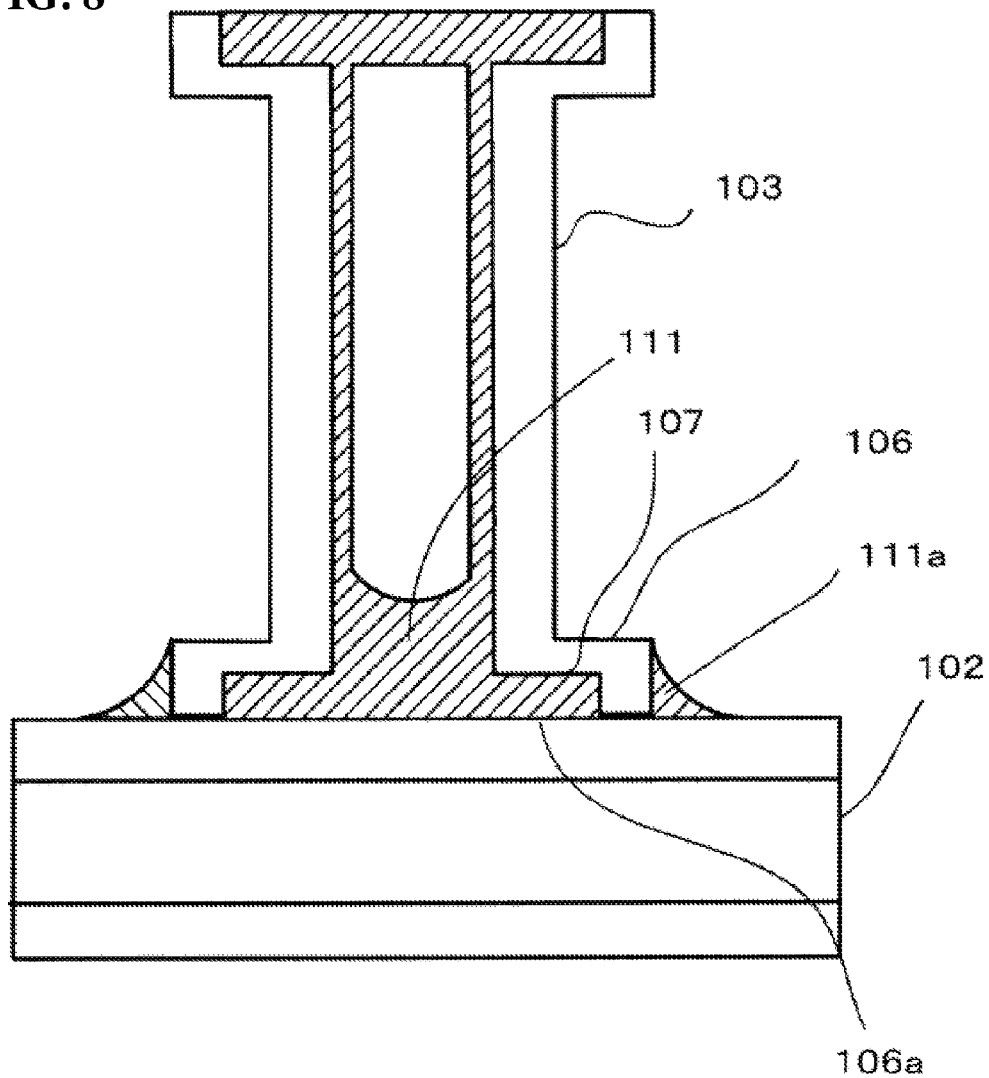
FIG. 8 is a cross-sectional view of a conventional contact component for describing a phenomenon in which solder that has been filled inside the cylinder climbs up the inner walls of the cylinder due to a capillary phenomenon and either collects on the inner walls or a portion of the solder is discharged from an upper side opening of the cylinder.

FIG. 4(a) is a cross-sectional view of a contact component according to the fourth embodiment of the present invention. FIG. 4(b) is a cross-sectional view of the portion inside the broken line frame in FIG. 11, depicting a state where the contact component according to the fourth embodiment of the present invention has been soldered onto an insulating substrate. The semiconductor module 202 according to the fourth embodiment of the present invention differs in that the contact component 3 mounted on the semiconductor module 200 according to the first embodiment is changed to a contact component 3c according to the present invention. However, the remainder of the structure and mounted components may be the same or different. In FIG. 4(b), the size of the concave portion 7 which is formed in the lower side of the inner circumference-side edge 10 of the contact component 3c is the same as the conventional contact component 103 depicted in FIG. 9(c). More specifically, the amount of solder is reduced to an extent such that the solder does not infiltrate into the inner circumference-side space from the edge 10. However, a ring-shaped projecting portion 12 is provided about the entire circumference of the upper side of the outer circumference-side front end of the flange 6, and the height t of the outer circumference-side surface of the flange 6 is two times the thickness d of the cylindrical portion of the contact component 3c. The height of the outer circumference-side surface of the flange 6 in the conventional contact component 103 is approximately the same as the thickness of the cylindrical portion of the contact component 3c, but in the present embodiment, the height of the outer circumference-side surface of the flange 6 is greater than that in the conventional art. As a result of this, it is possible to increase the volume of the solder fillet which is formed on the outer circumference-side surface of the flange 6, while achieving a small amount of solder collected in the concave portion 7 on the lower side of the flange 6. Therefore, it is possible to obtain beneficial effects both in terms of suppressing the wicking phenomenon and improving the solder junction strength. The height t of the outer circumference-side surface of the flange 6 should be in a range from two times the thickness d of the cylindrical portion of the contact component 3c, up to the height of the contact component 3c, as described above.

The shape of the flange 6 shown in FIGS. 4(a), 4(b) can be formed by pressing (bending) the front end portion of the flange. In the description of the fourth embodiment described above, an example is given in which a ring-shaped projecting portion 12 is provided in order to raise the height at the outer circumference of the flange 6, but the method of raising the height at the outer circumference of the flange 6 is not limited to this, and the same can also be achieved by increasing the thickness of the entire flange 6. Moreover, if the angle θ2 of the outer circumference section of the flange 6 is in a range of ±30° from 0°, then manufacturing is facilitated, and the beneficial effects described above are exhibited satisfactorily.

Furthermore, by adopting a contact component having a shape which combines the shape of the cut-out portion (chamfered portion 10a, step portion 10b, groove 10c) described in the first, second, and third embodiments above, and the shape of the flange 6 in the fourth embodiment, the solder wicking phenomenon is suppressed more effectively, and the solder junction strength can be further improved.

Figure 9A:
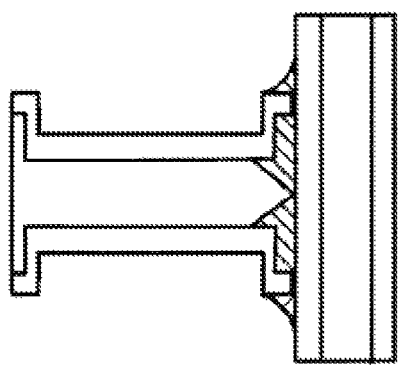
FIGS. 9(a) to 9(c) are cross-sectional views showing aspects of the solder junctions between a contact component and an insulating substrate in which the amount of solder contributing to the junction is reduced in sequence from FIGS. 9(a) to 9(c).
Figure 9B:
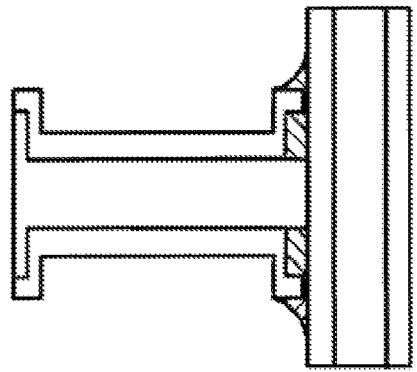
Figure 9C:
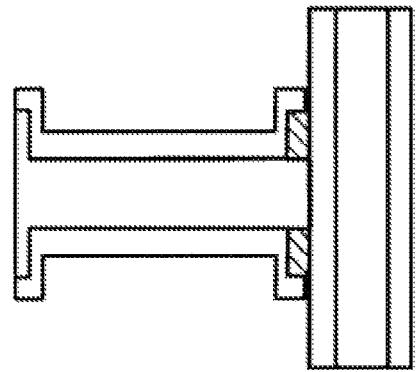
Figure 10:
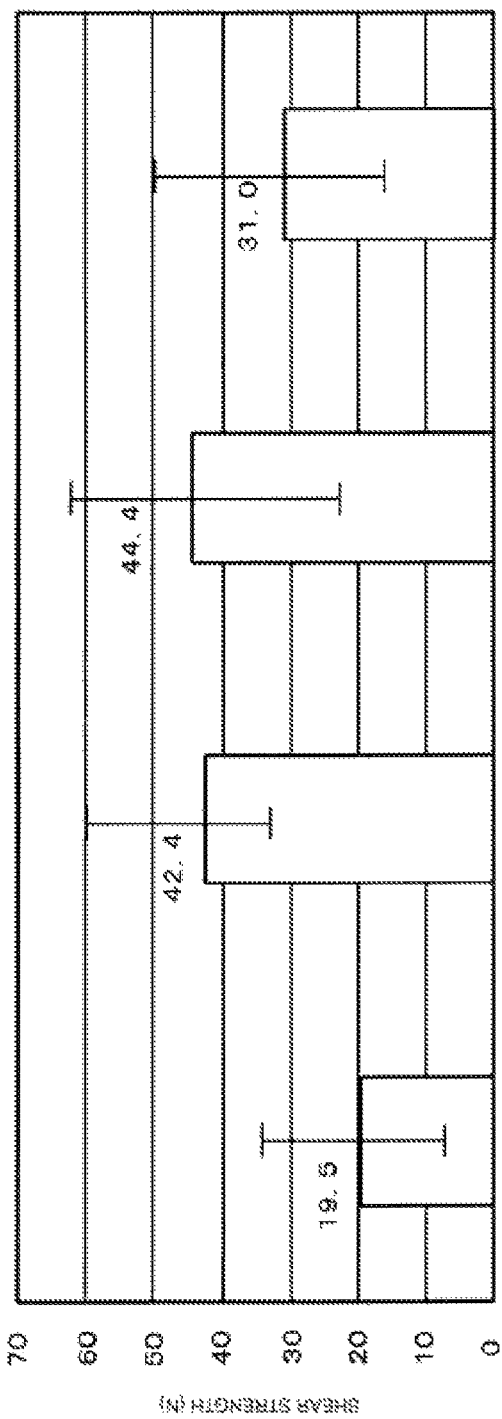
FIG. 10 is a comparative diagram showing the solder junction strength according to the present invention and the conventional art by a comparison of shear strength.
Figure 13A:
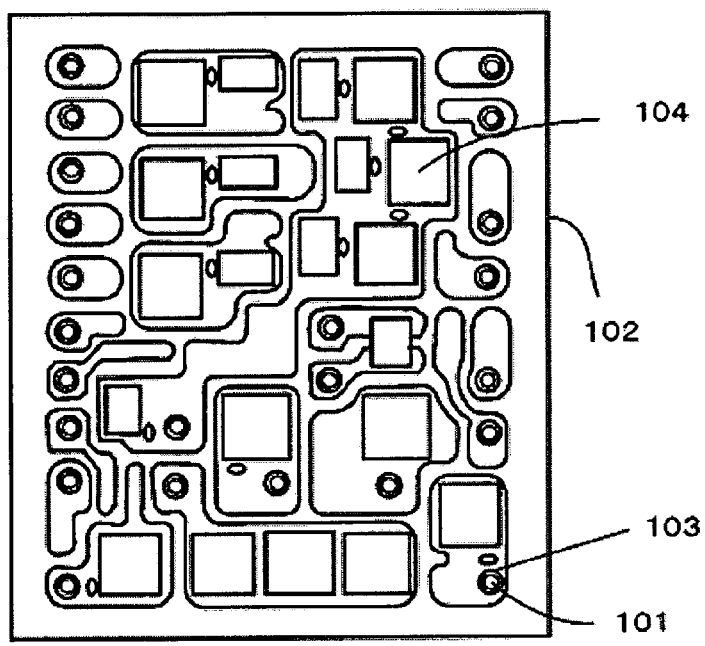
FIG. 13(a) is a top view of an insulating substrate constituting the semiconductor module in FIG. 12.
Figure 13B:
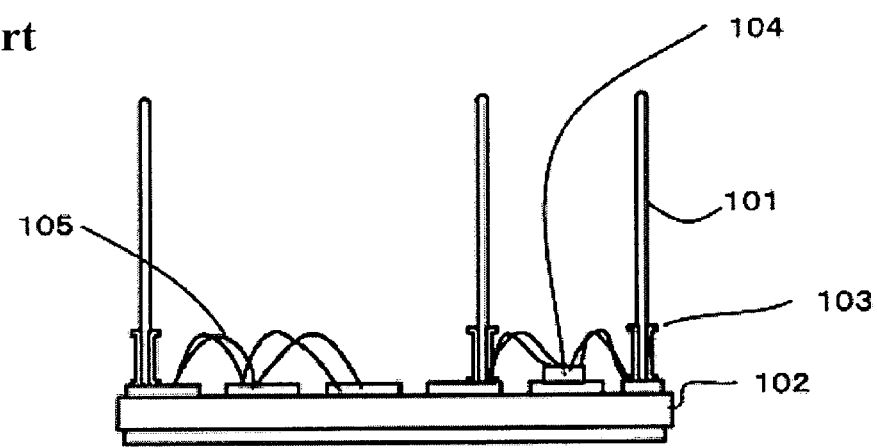
FIG. 13(b) is a cross-sectional view from the side thereof.
Figure 14:
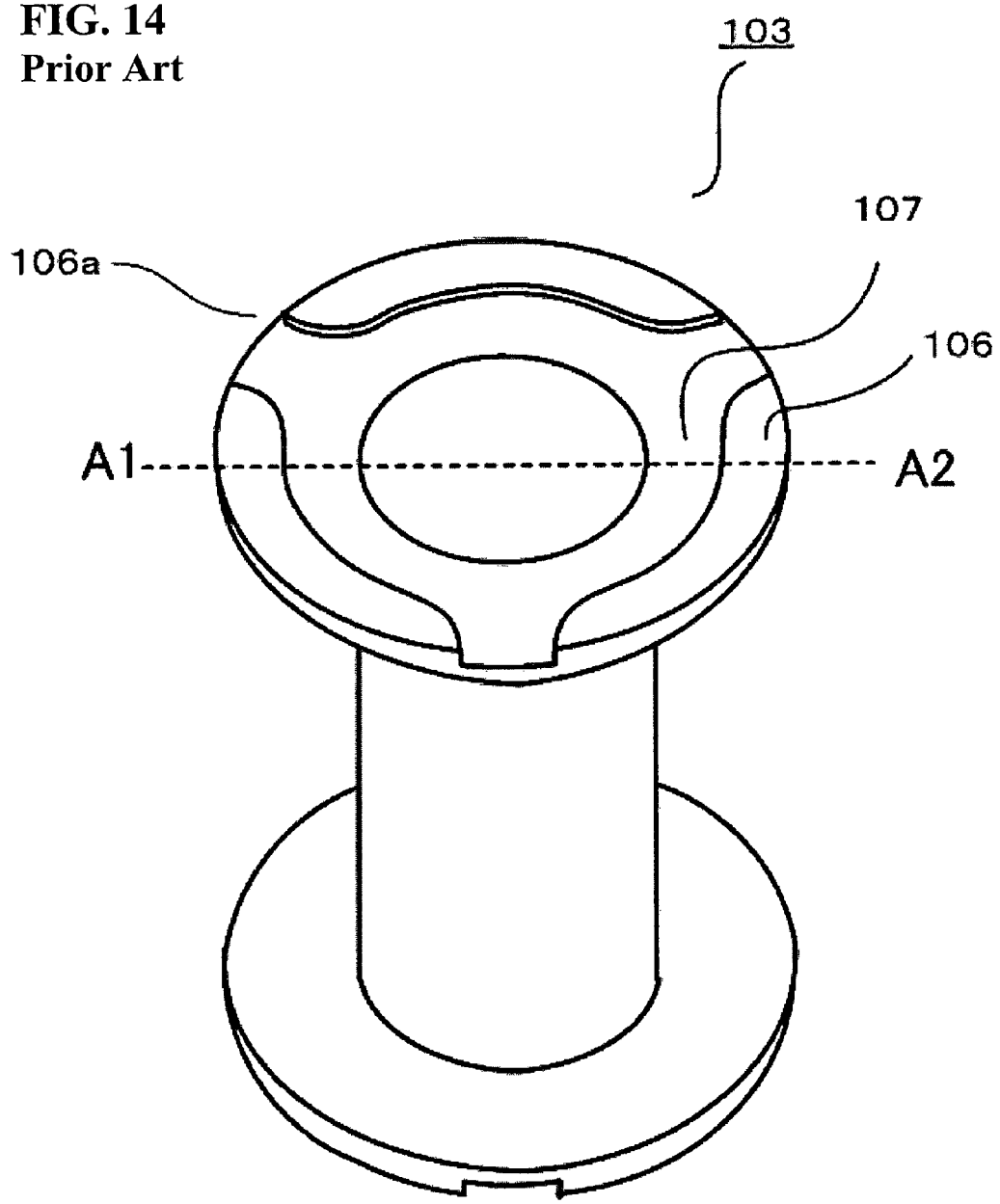
FIG. 14 is a perspective view of a conventional contact component.

FIG. 10 shows the results of a comparison, based on shear strength measurement, of the solder junction strengths of a conventional cylindrical contact component as shown in FIGS. 9(a) and 9(c), and a cylindrical contact component as described in the first to fourth embodiments illustrated in FIG. 1(b) and FIG. 4(b), when soldered onto the insulating substrate 102 shown in FIGS. 13(a), 13(b). In FIG. 10, the distribution range of the measurement value of the shear strength is indicated by the line, and the average value is indicated by the bar graph. From FIG. 10, in relation to the solder junction strength, it can be seen that the components in FIG. 9(a) relating to the conventional art and FIG. 1(b) relating to the first embodiment have a strength of no less than 40 N, and the component in FIG. 4(b) has a strength of no less than 30 N, and therefore sufficient junction strength can be guaranteed. However, although the conventional art example shown in FIG. 9(a) has sufficient shear strength, a solder wicking phenomenon is observed, which is not desirable for practical application. Furthermore, in the case of the conventional art example in FIG. 9(c), although the average solder junction strength is no less than 10 N, looking at the measurement distribution, there are shear strength measurements below 10 N, and hence these components are not desirable either.

Similar beneficial results to those in FIG. 1(b) above were also obtained in respect to the contact component in the embodiment shown in FIG. 2(b) and the contact component in the embodiment shown in FIG. 3, when soldered onto the insulating substrate 102.

According to the embodiments described above, it is possible to provide a contact component, and a semiconductor module using the same, wherein a solder junction strength equal to or greater than that of the conventional art can be obtained, even in a solder junction state in which the amount of solder is reduced in order to prevent defects due to solder climb-up and in which the inside of the cylinder of the contact component 103 is not filled with solder.

The description given above gives a simple indication of the principle of the present invention. Moreover, a large number of modifications and variations would be possible for a person skilled in the art, and the present invention is not limited to the precise configuration and application examples given above, and all corresponding modifications and equivalent configurations are considered to come within the scope of the present invention according to the accompanying claims and equivalent configurations.

EXPLANATION OF REFERENCE NUMERALS 3, 3a, 3b, 103 contact component
6, 106 flange
6a, 106a end face
7, 107 concave portion
10 edge
10a chamfered portion
10b step portion
10c groove
11, 111 solder
12 projecting portion
100, 200, 201, 202 semiconductor module
101 external output terminal
102 insulating substrate
104 semiconductor chip
105 aluminum wire
108 resin case
109 metal substrate
110 curve
111a solder fillet

What is claimed is:

1. A contact component adapted to be soldered onto a metal region provided on an insulating substrate of a semiconductor module, the contact component comprising:
   a cylindrical portion having a hollow hole for fitting an external terminal; and
   a flange formed at a lower end portion of the cylindrical portion, and having an external diameter larger than an external diameter of the cylindrical portion, wherein an end face of the flange adapted to be soldered includes a flat bottom surface and a concave portion extending from an inner circumference edge of the cylindrical portion in the flat bottom surface to an outer circumference edge of the flange,
   wherein the cylindrical portion includes a cut-out portion at an inner side of a lower end thereof.

2. The contact component according to claim 1, wherein the cut-out portion is a chamfered portion formed in at least a portion of the inner side of the lower end of the cylindrical portion.

3. The contact component according to claim 1, wherein the cut-out portion is a step portion formed in at least a portion of the inner side of the lower end of the cylindrical portion.

4. The contact component according to claim 1, wherein the cut-out portion is a recessed surface portion formed in at least a portion of the inner side of the lower end of the cylindrical portion.

5. The contact component according to claim 1, wherein the hollow hole for fitting the external terminal has a circular or square cross-sectional shape.

6. A contact component adapted to be soldered onto a metal region provided on an insulating substrate of a semiconductor module, the contact component comprising:

a cylindrical portion having a hollow hole for fitting an external terminal, and a uniform thickness; and a flange formed at a lower end portion of the cylindrical portion, the flange having an external diameter larger than an external diameter of the cylindrical portion, and a height at an outer circumference edge thereof no less than two times the thickness of the cylindrical portion, wherein an end face of the flange adapted to be soldered includes a flat bottom surface and a concave portion extending from an inner circumference edge of the cylindrical portion in the flat bottom surface to the outer circumference edge of the flange.

7. The contact component according to claim 6, wherein the flange in which the height at the outer circumference edge thereof is no less than two times the thickness of the cylindrical portion, is a processed surface forming a projecting portion extending upward in at least a portion of the outer circumference edge of the flange.

8. The contact component according to claim 6, wherein the hollow hole for fitting the external terminal has a circular or a square cross-sectional shape.

9. The contact component according to claim 6, wherein the flange is provided on two ends of the cylindrical portion.

10. The contact component according to claim 6, wherein the height is between the end face of the flange and a top surface of the outer circumference edge of the flange, the top surface of the outer circumference edge of the flange having a flat surface.

11. The contact component according to claim 6, wherein the height is between the end face of the flange and a top surface of the outer circumference edge of the flange, and the flange is a processed surface forming a projecting portion extending upward in at least a portion of the outer circumference edge of the flange.

12. A semiconductor module, comprising:
an insulating substrate;
a contact component soldered onto a metal region provided on the insulating substrate, including
a cylindrical portion having a hollow hole,
a flange formed at a lower end portion of the cylindrical portion and having an external diameter larger than an external diameter of the cylindrical portion, wherein an end face of the flange to be soldered includes a flat bottom surface and a concave portion extending from an inner circumference edge of the cylindrical portion in the flat bottom surface to an outer circumference edge of the flange, and
a cut-out portion provided at an inner side of a lower end of the cylindrical portion; and
an external terminal fitting into the hollow hole.

13. A semiconductor module, comprising:
an insulating substrate;
a contact component soldered onto a metal region provided on the insulating substrate, including
a cylindrical portion having a hollow hole, and a uniform thickness,
a flange formed at a lower end of the cylindrical portion, the flange having an external diameter larger than an external diameter of the cylindrical portion of the contact component, and a height at an outer circumference edge thereof no less than two times the thickness of the cylindrical portion of the contact component, wherein an end face of the flange to be soldered includes a flat bottom surface and a concave portion extending from an inner circumference edge of the cylindrical portion in the flat bottom surface to the outer circumference edge of the flange; and
an external terminal fitting into the hollow hole.

* * * * *